United States Patent
Wang et al.

(10) Patent No.: US 8,952,245 B2
(45) Date of Patent: Feb. 10, 2015

(54) CONDUCTIVE THICK FILM PASTE FOR SOLAR CELL CONTACTS

(71) Applicant: Heraeus Precious Metals North America Conshohocken LLC, West Conshohocken, PA (US)

(72) Inventors: Lei Wang, Conshohocken, PA (US); Cuiwen Guo, Horsham, PA (US); Raymond Michael Cosimano, Philadelphia, PA (US); Weiming Zhang, West Conshohocken, PA (US)

(73) Assignee: Heraeus Precious Metals North America Conshohocken LLC, West Conshohocken, PA (US)

( * ) Notice: Subject to any disclaimer, the term of this patent is extended or adjusted under 35 U.S.C. 154(b) by 0 days.

(21) Appl. No.: 13/746,462

(22) Filed: Jan. 22, 2013

(65) Prior Publication Data
US 2013/0228207 A1     Sep. 5, 2013

Related U.S. Application Data

(60) Provisional application No. 61/589,727, filed on Jan. 23, 2012.

(51) Int. Cl.
| | |
|---|---|
| *H01L 31/0224* | (2006.01) |
| *H01L 31/028* | (2006.01) |
| *H01L 31/0232* | (2014.01) |
| *C03C 8/18* | (2006.01) |
| *C03C 8/10* | (2006.01) |
| *C03C 8/16* | (2006.01) |
| *H01B 1/22* | (2006.01) |

(52) U.S. Cl.
CPC ...... *H01L 31/022425* (2013.01); *H01L 31/028* (2013.01); *H01L 31/0232* (2013.01); *C03C 8/18* (2013.01); *C03C 8/10* (2013.01); *C03C 8/16* (2013.01); *H01B 1/22* (2013.01); *Y02E 10/50* (2013.01)
USPC ............ 136/256; 136/252; 252/512; 252/514

(58) Field of Classification Search
USPC ........................... 136/256, 252; 252/512, 514
See application file for complete search history.

(56) References Cited

U.S. PATENT DOCUMENTS

| | | | |
|---|---|---|---|
| 4,959,090 | A | 9/1990 | Reinherz |
| 5,066,621 | A | 11/1991 | Akhtar |
| 2010/0037951 | A1 | 2/2010 | Borland et al. |
| 2011/0192457 | A1 | 8/2011 | Nakayama et al. |
| 2011/0232746 | A1 | 9/2011 | Carroll et al. |
| 2011/0308595 | A1 | 12/2011 | Carroll et al. |

*Primary Examiner* — Golam Mowla
(74) *Attorney, Agent, or Firm* — Blank Rome LLP

(57) ABSTRACT

The invention relates to an inorganic reaction system used in the manufacture of electroconductive pastes. The inorganic reaction system comprises a lead containing composition and elemental tellurium, where in the lead containing composition is between 5-95 wt. % of the inorganic reaction system, and the elemental tellurium is between 5-95 wt. % of the inorganic reaction system. More preferably, the lead containing composition is between 40-90 wt. % of the inorganic reaction system, and the elemental tellurium is between 10-40 wt. % of the inorganic reaction system. The lead containing composition can be a glass frit and can further comprise lead oxide. Another aspect of the invention relates to an electroconductive paste composition that comprises metallic particles, an inorganic reaction system as disclosed, and an organic vehicle. Another aspect of the invention relates to an organic vehicle that comprises a binder, a surfactant, a solvent, and a thixatropic agent. Another aspect of the invention relates to a solar cell printed with an electroconductive paste composition as disclosed, as well as an assembled solar cell module. Another aspect of the invention relates to a method of producing a solar cell.

18 Claims, 4 Drawing Sheets

CONDUCTIVE THICK FILM PASTE FOR SOLAR CELL CONTACTS

CROSS-REFERENCE TO RELATED APPLICATIONS

This application claims priority to U.S. Provisional App. No. 61/589,727, filed Jan. 23, 2012, the disclosure of which is incorporated herein by reference in its entirety.

FIELD OF THE INVENTION

The invention relates to electroconductive pastes as utilized in solar panel technology. Specifically, in one aspect, the invention relates to an inorganic reaction system for use in electroconductive pastes. Another aspect of the invention relates to an electroconductive paste composition comprising a conductive metal component, an inorganic reaction system, and an organic vehicle. Another aspect of the invention relates to a solar cell produced by applying an electroconductive paste, which comprises an electroconductive metal, an inorganic reaction system, and an organic vehicle, to a silicon wafer. Yet another aspect of the invention relates to a solar cell module assembled using solar cells produced by applying an electroconductive paste to a silicon wafer, wherein the electroconductive paste comprises an electroconductive metal, an inorganic reaction system, and an organic vehicle.

BACKGROUND OF THE INVENTION

Solar cells are devices that convert the energy of light into electricity using the photovoltaic effect. Solar power is an attractive green energy source because it is sustainable and produces only non-polluting by-products. Accordingly, a great deal of research is currently being devoted to developing solar cells with enhanced efficiency while continuously lowering material and manufacturing costs.

When light hits a solar cell, a fraction of the incident light is reflected by the surface and the remainder transmitted into the solar cell. The transmitted light/photons are absorbed by the solar cell, which is usually made of a semiconducting material, such as silicon. The absorbed photon energy excites electrons from the atoms of the semiconducting material, generating electron-hole pairs. These electron-hole pairs are then separated by p-n junctions and collected by conductive electrodes that are applied on the solar cell surface. These conductive electrodes typically comprise an electroconductive paste composition.

Traditional electroconductive pastes contain metallic particles, glass frit, and an organic vehicle. These components are usually selected to take full advantage of the theoretical potential of the resulting solar cell. The metallic particles act as the conductive component of the surface electrode. The organic vehicle provides the medium through which all of the components are combined. The glass frit component has a number of purposes, one of which is to improve contact between the electrode and the underlying silicon surface. It is desirable to maximize the contact between the electroconductive paste and silicon surface, as well as with the metallic particles themselves, so that the charge carriers can flow through the interface and then through the surface electrodes. The glass particles in the electroconductive paste provide the media by which the paste builds contact between the metal and the underlying silicon substrate. The glass component must have specific properties in order to achieve optimal contact. Thus, the goal is to minimize contact resistance while improving solar cell efficiency. Known glass compositions have high contact resistance due to the insulating effect of the glass in the interface of the electrode and silicon wafer. Further, glass frit is known to have wide melting temperature ranges, making their behavior strongly dependent on the processing parameters. Accordingly, electroconductive paste compositions with improved electrical properties are desirable. Specifically, electroconductive paste compositions with improved glass frit components are needed.

U.S. Patent Application Publication No. 2011/0308595 A1 discloses a thick-film paste for printing on the front-side of a solar cell device having one or more insulating layers. The thick-film paste comprises an electrically conductive metal, and lead-tellurium-oxide dispersed in an organic medium. The lead-tellurium-oxide is present in an amount of 0.5 to 15 wt. % of solids of the paste and the molar ratio of lead to tellurium is between 5/95 and 95/5. The lead-tellurium-oxide (Pb—Te—O) is prepared by mixing $TeO_2$ and lead oxide powders, heating the powder mixture in air or an oxygen-containing atmosphere to form a melt, quenching the melt, grinding and ball-milling the quenched material, and screening the milled material to provide a powder with the desired particle size.

U.S. Pat. No. 5,066,621 ("'621 patent") discloses a sealing glass composition comprising, in wt. %, 13-50% lead oxide, 20-50% vanadium oxide, 2-40% tellurium oxide, up to 40% selenium oxide, up to 10% phosphorous oxide, up to 5% niobium oxide, up to 20% bismuth oxide, up to 5% copper oxide and up to 10% boron oxide and an electrically conductive formulation comprising, in wt. %, 50-77% silver, 8-34% of a sealing glass composition as described previously, 0.2-1.5% resin and thixotrope and 10-20% organic solvent. The '621 patent discloses tellurium oxide in a preferred range of 9-30 wt. %.

U.S. Patent Application Publication No. 2011/0192457 ("'457 publication") discloses an electroconductive paste containing an electro-conductive particle, an organic binder, a solvent, a glass frit, and an organic compound including alkaline earth metal, a metal with a low melting point or a compound affiliated with a metal with a low melting point. The '457 publication teaches the use of bismuth (Bi) containing glass frit and barium (Ba) containing glass frit.

U.S. Patent Application Publication No. 2010/0037951 discloses methods of making multi-element, finely divided, metal powders containing one or more reactive metals and one or more non-reactive metals. Reactive metals include metals or mixtures thereof such as titanium (Ti), zirconium (Zr), hafnium (Hf), tantalum (Ta), niobium (Nb), vanadium (V), nickel (Ni), cobalt (Co), molybdenum (Mo), manganese (Mn), and iron (Fe). Non-reactive metals include metals or mixtures such as silver (Ag), tin (Sn), bismuth (Bi), lead (Pb), antimony (Sb), zinc (Zn), germanium (Ge), phosphorus (P), gold (Au), cadmium (Cd), berrylium (Be), tellurium (Te).

SUMMARY OF THE INVENTION

The invention provides an inorganic reaction system comprising a lead containing composition and elemental tellurium, wherein the lead containing composition is between 5-95 wt. % of the inorganic reaction system, and the elemental tellurium is between 5-95 wt. % of the inorganic reaction system.

According to another aspect of the invention, the inorganic reaction system comprises a lead containing composition between 40-90 wt. % of the inorganic reaction system, and elemental tellurium between 10-40 wt. % of the inorganic reaction system.

According to another aspect of the invention, the lead containing composition is a glass frit with an amorphous or partially crystalline structure. According to another aspect of the invention, the lead containing composition comprises lead oxide. According to yet another aspect of the invention, the lead containing composition comprises between about 5-95 wt. %, preferably about 10-90 wt. %, more preferably about 40-80 wt. %, and even more preferably about 45-75 wt. %, lead oxide. In another embodiment, the lead containing composition is a low-lead composition comprising between about 10-45 wt. %, preferably about 10-40 wt. %, more preferably about 10-15 wt. %, lead oxide.

The invention also provides an electroconductive paste composition comprising metallic particles, an inorganic reaction system, and an organic vehicle.

According to one aspect of the invention, the metallic particles in the electroconductive paste are at least one of silver, gold, copper, and nickel. According to another aspect of the invention, the metallic particles in the electroconductive paste are silver. According to another aspect of the invention, the metallic particles in the electroconductive paste are about 75-95 wt. % of the paste.

According to another aspect of the invention, the organic vehicle comprises a binder, a surfactant, an organic solvent, and a thixatropic agent. According to another aspect of the invention, the binder is about 1-10 wt. % of the organic vehicle and comprises at least one of ethylcellulose or phenolic resin, acrylic, polyvinyl butyral or polyester resin, polycarbonate, polyethylene or polyurethane resins, or rosin derivatives. The surfactant is about 1-10 wt. % of the organic vehicle and comprises at least one of polyethyleneoxide, polyethyleneglycol, benzotriazole, poly(ethyleneglycol)acetic acid, lauric acid, oleic acid, capric acid, myristic acid, linolic acid, stearic acid, palmitic acid, stearate salts, palmitate salts, and mixtures thereof. The organic solvent is about 50-70% wt. % of the organic vehicle and comprises at least one of carbitol, terpineol, hexyl carbitol, texanol, butyl carbitol, butyl carbitol acetate, dimethyladipate, or glycol ether. The thixatropic agent is about 0.1-5 wt. % of the organic vehicle.

The invention further provides a solar cell produced by applying the electroconductive paste of the invention to a silicon wafer and firing the silicon wafer.

The invention further provides a solar cell module comprising electrically interconnected solar cells made with the electroconductive paste of the invention.

The invention further provides a method of producing a solar cell, comprising the steps of providing a silicon wafer having an antireflective coating, applying the electroconductive paste of the invention to the silicon wafer, and firing the silicon wafer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION

Figure 1:
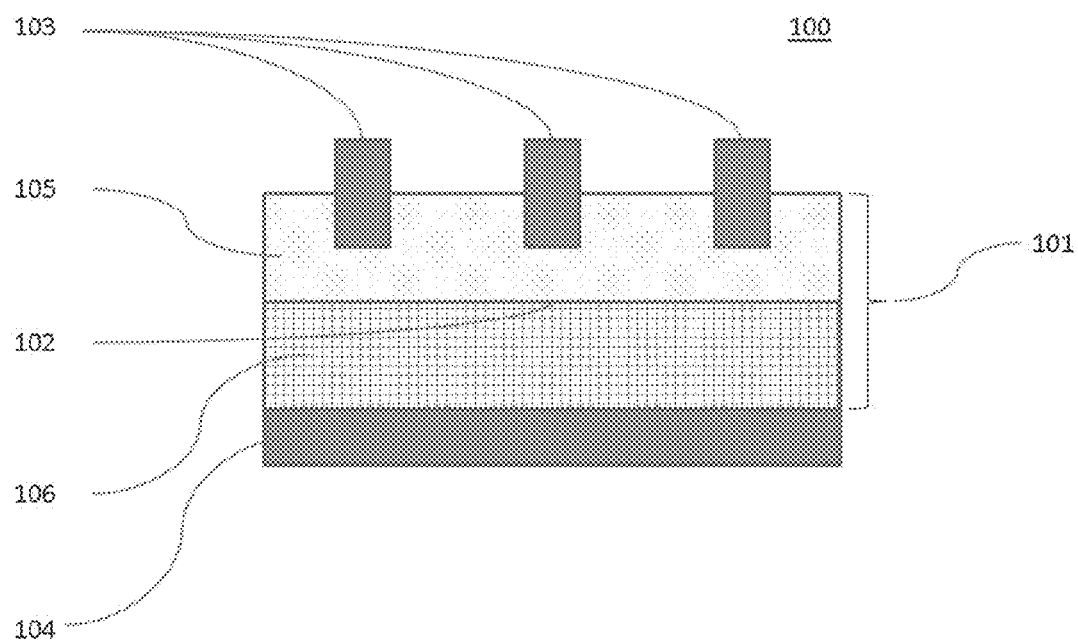
FIG. 1 is a cross-sectional view of an assembled solar cell in accordance with an exemplary embodiment of the invention.

The invention relates to electroconductive paste compositions as used in the manufacturing of solar cells. Electroconductive pastes typically comprise metallic particles, glass frit, and an organic vehicle. While not limited to such an application, such pastes may be used to form an electrical contact layer or electrode on a solar cell. Specifically, the pastes may be applied to the front side of a solar cell or to the back side of a solar cell and provide the path by which conductivity occurs between cells.

Inorganic Reaction System (IRS)

In one aspect, the invention relates to an inorganic reaction system for use, for example, in an electroconductive paste composition.

The IRS of the invention replaces the role of the traditional glass frit component. First, the IRS provides a delivery media for the metallic particles, allowing them to migrate from the paste to the interface of the metal conductor and the semiconductor substrate. The IRS also provides a reaction media for the paste components to undergo physical and chemical reactions at the interface. Physical reactions include, but are not limited to, melting, dissolving, diffusing, sintering, precipitating, and crystallizing. Chemical reactions include, but are not limited to, synthesis (forming new chemical bonds) and decomposition, reduction and oxidation, and phase transitioning. Lastly, the IRS acts as an adhesion media that provides the bonding between the metal conductor and the semiconductor substrate, thereby securing reliable electrical contact performance during the lifetime of the solar device. Although intended to achieve the same effects, existing glass frit compositions can result in high contact resistance due to the insulating effect of the glass in the interface of the metallic layer and silicon wafer. The IRS of the invention acts as a delivery, reaction, and adhesion media, but provides much lower contact resistance and higher overall cell efficiency. According to the invention, the IRS is about 1-15 wt. % of paste, preferably about 2-8 wt. %, even more preferably about 3-5 wt. % of paste.

More specifically, the IRS of the invention provides improved Ohmic and Schottky contact between the metal conductor (e.g., silver) and the semiconductor emitter (e.g., silicon substrate) in the solar cell. The IRS of the invention is a reactive media with respect to the silicon and creates active areas on the silicon emitter that improve overall contact mechanisms, such as through direct contact, or tunneling. The improved contact properties provide better Ohmic contact and Schottky contact, and therefore better overall solar cell performance.

The IRS of the invention may comprise crystalline or partially crystalline materials. The IRS may comprise glass, ceramic, or any compounds known to one skilled in the art that can form a matrix at elevated temperature. Traditionally used glass frits in electroconductive pastes are just an example of the types of materials which may be used. Another example is a mixture of amorphous, crystalline, or semi-crystalline materials, e.g., oxides that can form a matrix at the firing temperature of the IRS and electroconductive paste. The IRS of this invention may also comprise various compounds including, but not limited to, oxides, salts, fluorides, and sulfides, as well as alloys, and elemental materials.

Additionally, the IRS may also comprise oxides or compounds known to one skilled in the art to adjust processing parameters, such as glass transition temperature, or improve IRS performance, such as optimizing contact characteristics with the silicon substrate. For example, the IRS may comprise oxides or other compounds of silicon, boron, aluminum, bismuth, lithium, sodium, magnesium, zinc, titanium, zirconium, or phosphorous. Other matrix formers or modifiers, such as germanium oxide, vanadium oxide, tungsten oxide, molybdenum oxides, niobium oxides, tin oxides, indium oxides, other alkaline and alkaline earth metal (such as K, Rb, Cs and Be, Ca, Sr, Ba) compounds, rare earth oxides (such as $La_2O_3$, cerium oxides), phosphorus oxides or metal phosphates, transition metal oxides (such as copper oxides and chromium oxides), metal halides (such as lead fluorides and zinc fluorides) may also be part of the IRS composition. According to certain embodiments disclosed herein, the IRS may comprise at least one additive selected from the group consisting of: $Al_2O_3$, ZnO, $Li_2O$, $Ag_2O$, AgO, $MoO_3$, $TiO_2$, $TeO_2$, CoO, $Co_2O_3$, $Bi_2O_3$, $CeO_2$, $CeF_4$, $SiO_2$, MgO, PbO, $ZrO_2$, $HfO_2$, $In_2O_3$, $SnO_2$, $P_2O_5$, $Ta_2O_5$, $B_2O_3$, $Ag_3PO_4$, $LiCoO_2$, $LiNiO_2$, $Ni_3(PO_4)_2$, NiO, or lithium phosphates.

It is well known to the person skilled in the art that the IRS materials can exhibit a variety of shapes, surface natures, sizes, surface area to volume ratios and coating layers. A large number of shapes of IRS material particles are known to the person skilled in the art. Some examples are spherical, angular, elongated (rod or needle like) and flat (sheet like). IRS particles may also be present as a combination of particles of different shapes. IRS particles with a shape, or combination of shapes, which favors advantageous sintering, adhesion, electrical contact and electrical conductivity of the produced electrode are preferred according to the invention.

A way to characterize the shape and surface of a particle is by its surface area to volume ratio. The lowest value for the surface area to volume ratio of a particle is embodied by a sphere with a smooth surface. The less uniform and uneven a shape is, the higher its surface area to volume ratio will be. In one embodiment according to the invention, IRS particles with a high surface area to volume ratio are preferred, preferably in a range from about $1.0 \times 10^7$ to about $1.0 \times 10^9$ m$^{-1}$, more preferably in a range from about $5.0 \times 10^7$ to about $5.0 \times 10^8$ m$^{-1}$ and most preferably in a range from about $1.0 \times 10^8$ to about $5.0 \times 10^8$ m$^{-1}$. In another embodiment according to the invention, IRS particles with a low surface area to volume ratio are preferred, preferably in a range from about $6 \times 10^5$ to about $8.0 \times 10^6$ m$^{-1}$, more preferably in a range from about $1.0 \times 10^6$ to about $6.0 \times 10^6$ m$^{-1}$ and most preferably in a range from about $2.0 \times 10^6$ to about $4.0 \times 10^6$ m$^{-1}$.

The average particles diameter $d_{50}$, and the associated parameters $d_{10}$ and $d_{90}$ are characteristics of particles well known to the person skilled in the art. It is preferred according to the invention that the average particle diameter $d_{50}$ of the IRS particles lies in a range from about 0.5 to about 10 μm, more preferably in a range from about 1 to about 7 μm and most preferably in a range from about 1 to about 5 μm. The determination of the particles diameter $d_{50}$ is well known to the person skilled in the art.

The IRS particles may be present with a surface coating. Any such coating known to the person skilled in the art and which he considers to be suitable in the context of the invention can be employed on the IRS particles. Preferred coatings according to the invention are those coatings which promote improved printing, sintering and etching characteristics of the electro-conductive paste. If such a coating is present, it is preferred according to the invention for that coating to correspond to no more than about 10 wt. %, preferably no more than about 8 wt. %, most preferably no more than about 5 wt. %, in each case based on the total weight of the IRS particles.

The Tellurium Containing IRS

The preferred embodiment of the invention relates to an IRS as used in an electroconductive paste comprising a lead containing composition and an elemental tellurium additive, wherein the lead containing composition is a glass frit comprising lead oxide. The inclusion of elemental tellurium greatly improves contact with the semiconductor emitter. The lead containing composition is between 5-95 wt. % of the IRS, more preferably between 40-90 wt. % of the IRS. The elemental tellurium is between 5-95 wt. % of the IRS, more preferably between 10-40 wt. % of the IRS.

Elemental tellurium is a chemical element characterized by having a brittle, silvery-white appearance. Tellurium has an element number of 52, and its elemental symbol is Te. Its standard atomic weight is 127.60, and its melting point is 449.51° C. Naturally, elemental tellurium has a hexagonal crystal structure, although tellurium can be made into an amorphous form by precipitating it from a solution, such as telluric acid solution. Elemental tellurium is a metalloid, having properties of both a metal and a nonmetal. It exhibits conductive behavior similar to a semiconductor, and its conductivity increases slightly when exposed to light. The purity of elemental tellurium is usually above 99%, with purity typically ranging from 99.5-99.9%. For purposes of the invention, the elemental tellurium need not have purity above 99%, and can be used in a purity ranging from 90-99%.

In one embodiment, the lead containing composition is substantially amorphous. In another embodiment, the lead containing composition incorporates crystalline phases or compounds. In a further embodiment, the lead containing composition may be a mixture of crystalline or amorphous lead oxide or compounds known to one skilled in the art.

In a preferred embodiment, the lead containing composition is a type of glass frit (with an amorphous or partially crystalline structure) having lead containing compounds as starting materials. The higher the amount of lead in the glass frit, the lower the glass transition temperature of the glass. However, higher lead amounts may also cause shunting in the semiconductor substrate, thereby decreasing the resulting solar cell's efficiency. In a preferred embodiment, lead oxide is used. More preferably, the glass frit comprises about 5-95 wt. %, preferably about 10-90 wt. %, more preferably 40-80 wt. %, and even more preferably about 45-75 wt. %, lead oxide. In another embodiment, the glass frit may contain a relatively low lead content, e.g., between about 5-45 wt. %, preferably about 10-40 wt. %, and more preferably about 10-15 wt. %, lead oxide.

Lead containing glass frit can be made by any process known to one skilled in the art. For example, glass frit components, in powder form, may be mixed together in a V-comb blender. The mixture is then heated to a very high temperature (around 1200° C.) for about 30-40 minutes. The glass is then quenched, taking on a sand-like consistency. This coarse glass powder is then milled, such as in a ball mill or jet mill, until a fine powder results. Lead containing glass frit can alternatively comprise lead oxides, salts of lead halides, lead chalcogenides, lead carbonate, lead sulfate, lead phosphate, lead nitrate and organometallic lead compounds or compounds that can form lead oxides or salts during thermal decomposition. In another embodiment, lead oxide may be mixed directly with other components of the IRS of the invention without the need of first processing the lead oxide into the form of a glass frit.

Forming the Inorganic Reaction System

The IRS described herein can be made by any process known to one skilled in the art, by mixing appropriate amounts of powders of the individual ingredients, heating the powder mixture in air or in an oxygen-containing atmosphere to form a melt, quenching the melt, grinding and ball milling the quenched material and screening the milled material to provide a powder with the desired particle size. For example, glass frit components, in powder form, may be mixed together in a V-comb blender. The mixture is then heated (e.g., to around 800-1200° C.) for about 30-40 minutes. The glass is then quenched, taking on a sand-like consistency. This coarse glass powder is then milled, such as in a ball mill or jet mill, until a fine powder results. Typically, the inorganic reaction system may be milled to an average particle sized of 0.01-10 µm, preferably 0.1-5 µm.

In another example, conventional solid state synthesis may be used to prepare the IRS described herein. In this case, raw materials are sealed in a fused-quartz tube or tantalum or platinum tube under vacuum, and then heated to about 700-1200° C. The materials dwell at this elevated temperature for about 12-48 hours and then are slowly cooled (about 0.1° C./minute) to room temperature. In some cases, solid state reactions may be carried out in an alumina crucible in air.

In another example, co-precipitation may be used to form the IRS. In this process, the metal elements are reduced and co-precipitated with other metal oxides or hydroxides to from a solution containing metal cations by adjusting the pH levels or by incorporating reducing agents. The precipitates of these metals, metal oxides or hydroxides are then dried and fired under vacuum at about 400-600° C. to form a fine powder.

The Electroconductive Paste

The invention also relates to an electroconductive paste composition. Preferred electroconductive pastes according to the invention are pastes which can be applied to a surface, and which, upon firing, form solid electrode bodies in electrical contact with that surface. The constituents of the paste and proportions thereof can be selected by the person skilled in the art such that the paste has the desired properties.

In one embodiment, the electroconductive paste composition comprises a conductive metal component, an inorganic reaction system (according to any of the embodiments described above), and an organic vehicle.

The Conductive Metal Component

Preferred metallic particles in the context of the invention are those which exhibit metallic conductivity or which yield a substance which exhibits metallic conductivity on firing. Metallic particles present in the electroconductive paste give metallic conductivity to the solid electrode which is formed when the electroconductive paste is sintered on firing. Metallic particles which favor effective sintering and yield electrodes with high conductivity and low contact resistance are preferred. Metallic particles are well known to the person skilled in the art. All metallic particles known to the person skilled in the art, and which are considered suitable in the context of the invention, may be employed as the metallic particles in the electroconductive paste. Preferred metallic particles according to the invention are metals, alloys, mixtures of at least two metals, mixtures of at least two alloys or mixtures of at least one metal with at least one alloy.

Preferred metals which may be employed as metallic particles according to the invention are Ag, Cu, Al, Zn, Pd, Ni or Pb and mixtures of at least two thereof, preferably Ag. Preferred alloys which may be employed as metallic particles according to the invention are alloys containing at least one metal selected from the list of Ag, Cu, Al, Zn, Ni, W, Pb and Pd or mixtures or two or more of those alloys.

In one embodiment according to the invention, the metallic particles comprise a metal or alloy coated with one or more different metals or alloys, for example copper coated with silver.

In a preferred embodiment, the metallic particles comprise Ag. In another embodiment, the metallic particles comprise a mixture of Ag with Al. The metallic particles may be present as elemental metal, one or more metal derivatives, or a mixture thereof. Suitable silver derivatives include, for example, silver alloys and/or silver salts, such as silver halides (e.g., silver chloride), silver nitrate, silver acetate, silver trifluoroacetate, silver orthophosphate, and combinations thereof.

As additional constituents of the metallic particles, further to above mentioned constituents, those constituents which contribute to more favorable sintering properties, electrical contact, adhesion and electrical conductivity of the formed electrodes are preferred according to the invention. All additional constituents known to the person skilled in the art, and which are considered to be suitable in the context of the invention, may be employed in the metallic particles. Those additional constituents which represent complementary dopants for the face to which the electroconductive paste is applied are preferred according to the invention. When forming an electrode interfacing with a p-type doped Si layer, additives capable of acting as p-type dopants in Si are preferred. Preferred p-type dopants are group 13 elements or compounds which yield such elements on firing. Preferred group 13 elements in this context according to the invention are B and Al.

It is well known to the person skilled in the art that metallic particles can exhibit a variety of shapes, surfaces, sizes, surface area to volume ratios, oxygen content and oxide layers. A large number of shapes are known to the person skilled in the art. Some examples are spherical, angular, elongated (rod or needle like) and flat (sheet like). Metallic particles may also be present as a combination of particles of different shapes. Metallic particles with a shape, or combination of shapes, which favors advantageous sintering, electrical contact, adhesion and electrical conductivity of the produced electrode are preferred according to the invention. One way to characterize such shapes without considering surface nature is through the following parameters: length, width and thickness. In the context of the invention, the length of a particle is given by the length of the longest spatial displacement vector, both endpoints of which are contained within the particle. The width of a particle is given by the length of the longest spatial displacement vector perpendicular to the length vector defined above both endpoints of which are contained within the particle. The thickness of a particle is given by the length of the longest spatial displacement vector perpendicular to both the length vector and the width vector, both defined above, both endpoints of which are contained within the particle.

In one embodiment according to the invention, metallic particles with shapes as uniform as possible are preferred (i.e. shapes in which the ratios relating the length, the width and the thickness are as close as possible to 1, preferably all ratios lying in a range from about 0.7 to about 1.5, more preferably in a range from about 0.8 to about 1.3 and most preferably in a range from about 0.9 to about 1.2). Examples of preferred shapes for the metallic particles in this embodiment are spheres and cubes, or combinations thereof, or combinations of one or more thereof with other shapes. In another embodiment according to the invention, metallic particles are preferred which have a shape of low uniformity, preferably with at least one of the ratios relating the dimensions of length, width and thickness being above about 1.5, more preferably above about 3 and most preferably above about 5. Preferred shapes according to this embodiment are flake shaped, rod or needle shaped, or a combination of flake shaped, rod or needle shaped with other shapes.

A variety of surface types are known to the person skilled in the art. Surface types which favor effective sintering and yield advantageous electrical contact and conductivity of produced electrodes are favored for the surface type of the metallic particles according to the invention.

Another way to characterize the shape and surface of a metallic particle is by its surface area to volume ratio. The lowest value for the surface area to volume ratio of a particle is embodied by a sphere with a smooth surface. The less uniform and uneven a shape is, the higher its surface area to volume ratio will be. In one embodiment according to the invention, metallic particles with a high surface area to volume ratio are preferred, preferably in a range from about $1.0\times10^7$ to about $1.0\times10^9$ m$^{-1}$, more preferably in a range from about $5.0\times10^7$ to about $5.0\times10^8$ m$^{-1}$ and most preferably in a range from about $1.0\times10^8$ to about $5.0\times10^8$ m$^{-1}$. In another embodiment according to the invention, metallic particles with a low surface area to volume ratio are preferred, preferably in a range from about $6\times10^5$ to about $8.0\times10^6$ m$^{-1}$, more preferably in a range from about $1.0\times10^6$ to about $6.0\times10^6$ m$^{-1}$ and most preferably in a range from about $2.0\times10^6$ to about $4.0\times10^6$ m$^{-1}$.

The particle diameter $d_{50}$ and the associated values, $d_{10}$ and $d_{90}$, are characteristics of particles well known to the person skilled in the art. It is preferred according to the invention that the average particle diameter $d_{50}$ of the metallic particles lie in a range from about 2 to about 4 µm, more preferably in a range from about 2.5 to about 3.5 µm and most preferably in a range from about 2.8 to about 3.2 µm. The determination of the particle diameter $d_{50}$ is well known to a person skilled in the art.

In one embodiment of the invention, the metallic particles have a $d_{10}$ greater than about 1.5 µm, preferably greater than about 1.7 µm, more preferably greater than about 1.9 µm. The value of $d_{10}$ should not exceed the value of $d_{50}$.

In one embodiment of the invention, the metallic particles have a $d_{90}$ less than about 6 µm, preferably less than about 5 µm, more preferably less than about 4.5 µm. The value of $d_{90}$ should not be less than the value of $d_{50}$.

The metallic particles may be present with a surface coating. Any such coating known to the person skilled in the art, and which is considered to be suitable in the context of the invention, may be employed on the metallic particles. Preferred coatings according to the invention are those coatings which promote improved printing, sintering and etching characteristics of the electroconductive paste. If such a coating is present, it is preferred according to the invention for that coating to correspond to no more than about 10 wt. %, preferably no more than about 8 wt. %, most preferably no more than about 5 wt. %, in each case based on the total weight of the metallic particles.

In one embodiment, the metallic particles are greater than about 50 wt. % (of paste), preferably greater than about 70 wt. %, and most preferably greater than about 80 wt. %.

The Organic Vehicle

Preferred organic vehicles in the context of the invention are solutions, emulsions or dispersions based on one or more solvents, preferably an organic solvent, which ensure that the constituents of the electroconductive paste are present in a dissolved, emulsified or dispersed form. Preferred organic vehicles are those which provide optimal stability of constituents within the electroconductive paste and endow the electroconductive paste with a viscosity allowing effective line printability.

In one embodiment, the organic vehicle comprises an organic solvent and one or more of a binder (e.g., a polymer), a surfactant or a thixatropic agent, or any combination thereof. For example, in one embodiment, the organic vehicle comprises one or more binders in an organic solvent.

Preferred binders in the context of the invention are those which contribute to the formation of an electroconductive paste with favorable stability, printability, viscosity, sintering and etching properties. Binders are well known to the person skilled in the art. All binders which are known to the person skilled in the art, and which are considered to be suitable in the context of this invention, can be employed as the binder in the organic vehicle. Preferred binders according to the invention (which often fall within the category termed "resins") are polymeric binders, monomeric binders, and binders which are a combination of polymers and monomers. Polymeric binders can also be copolymers wherein at least two different monomeric units are contained in a single molecule. Preferred polymeric binders are those which carry functional groups in the polymer main chain, those which carry functional groups off of the main chain and those which carry functional groups both within the main chain and off of the main chain. Preferred polymers carrying functional groups in the main chain are for example polyesters, substituted polyesters, polycarbonates, substituted polycarbonates, polymers which carry cyclic groups in the main chain, poly-sugars, substituted poly-sugars, polyurethanes, substituted polyurethanes, polyamides, substituted polyamides, phenolic resins, substituted phenolic resins, copolymers of the monomers of one or more of the preceding polymers, optionally with other co-monomers, or a combination of at least two thereof. Preferred polymers which carry cyclic groups in the main chain are for example polyvinylbutylate (PVB) and its derivatives and poly-terpineol and its derivatives or mixtures thereof. Preferred poly-sugars are for example cellulose and alkyl derivatives thereof, preferably methyl cellulose, ethyl cellulose, propyl cellulose, butyl cellulose and their derivatives and mixtures of at least two thereof. Preferred polymers which carry functional groups off of the main polymer chain are those which carry amide groups, those which carry acid and/or ester groups, often called acrylic resins, or polymers which carry a combination of aforementioned functional groups, or a combination thereof. Preferred polymers which carry amide off of the main chain are for example polyvinyl pyrrolidone (PVP) and its derivatives. Preferred polymers which carry acid and/or ester groups off of the main chain are for example polyacrylic acid and its derivatives, polymethacrylate (PMA) and its derivatives or polymethylmethacrylate (PMMA) and its derivatives, or a mixture thereof. Preferred monomeric binders according to the invention are ethylene glycol based monomers, terpineol resins or rosin derivatives, or a mixture thereof. Preferred monomeric binders based on ethylene glycol are those with ether groups, ester groups or those with an ether group and an ester group, preferred ether groups being methyl, ethyl, propyl, butyl, pentyl hexyl and higher alkyl ethers, the preferred ester group being acetate and its alkyl derivatives, preferably ethylene glycol monobutylether monoacetate or a mixture thereof. Alkyl cellulose, preferably ethyl cellulose, its derivatives and mixtures thereof with other binders from the preceding lists of binders or otherwise are the most preferred binders in the context of the invention. The binder may be present in an amount between about 1 and 10 weight % of the organic vehicle, preferably between about 2-8 wt. %, more preferably between about 3-7 wt. %.

Preferred solvents according to the invention are constituents of the electroconductive paste which are removed from the paste to a significant extent during firing, preferably those which are present after firing with an absolute weight reduced by at least about 80% compared to before firing, preferably reduced by at least about 95% compared to before firing. Preferred solvents according to the invention are those which allow an electroconductive paste to be formed which has favorable viscosity, printability, stability and sintering characteristics and which yields electrodes with favorable electrical conductivity and electrical contact to the substrate. Solvents are well known to the person skilled in the art. All solvents which are known to the person skilled in the art, and which are considered to be suitable in the context of this invention, may be employed as the solvent in the organic vehicle. According to the invention, preferred solvents are those which allow the preferred high level of printability of the electroconductive paste as described above to be achieved. Preferred solvents according to the invention are those which exist as a liquid under standard ambient temperature and pressure (SATP) (298.15 K, 25° C., 77° F.), 100 kPa (14.504 psi, 0.986 atm), preferably those with a boiling point above about 90° C. and a melting point above about −20° C. Preferred solvents according to the invention are polar or non-polar, protic or aprotic, aromatic or non-aromatic. Preferred solvents according to the invention are mono-alcohols, di-alcohols, poly-alcohols, mono-esters, di-esters, poly-esters, mono-ethers, di-ethers, poly-ethers, solvents which comprise at least one or more of these categories of functional group, optionally comprising other categories of functional group, preferably cyclic groups, aromatic groups, unsaturated bonds, alcohol groups with one or more O atoms replaced by heteroatoms, ether groups with one or more O atoms replaced by heteroatoms, esters groups with one or more O atoms replaced by heteroatoms, and mixtures of two or more of the aforementioned solvents. Preferred esters in this context are di-alkyl esters of adipic acid, preferred alkyl constituents being methyl, ethyl, propyl, butyl, pentyl, hexyl and higher alkyl groups or combinations of two different such alkyl groups, preferably dimethyladipate, and mixtures of two or more adipate esters. Preferred ethers in this context are diethers, preferably dialkyl ethers of ethylene glycol, preferred alkyl constituents being methyl, ethyl, propyl, butyl, pentyl, hexyl and higher alkyl groups or combinations of two different such alkyl groups, and mixtures of two diethers. Preferred alcohols in this context are primary, secondary and tertiary alcohols, preferably tertiary alcohols, terpineol and its derivatives being preferred, or a mixture of two or more alcohols. Preferred solvents which combine more than one different functional groups are 2,2,4-trimethyl-1,3-pentanediol monoisobutyrate, often called texanol, and its derivatives, 2-(2-ethoxyethoxy)ethanol, often known as carbitol, its alkyl derivatives, preferably methyl, ethyl, propyl, butyl, pentyl, and hexyl carbitol, preferably hexyl carbitol or butyl carbitol, and acetate derivatives thereof, preferably butyl carbitol acetate, or mixtures of at least two of the aforementioned. The organic solvent may be present in an amount between about 30 and about 90 weight % of organic vehicle, more preferably about 50-70 weight % of organic vehicle.

The organic vehicle may also comprise a surfactant and/or additives. Preferred surfactants in the context of the invention are those which contribute to the formation of an electroconductive paste with favorable stability, printability, viscosity, sintering and etching properties. Surfactants are well known to the person skilled in the art. All surfactants which are known to the person skilled in the art, and which are considered to be suitable in the context of this invention, may be employed as the surfactant in the organic vehicle. Preferred surfactants in the context of the invention are those based on linear chains, branched chains, aromatic chains, fluorinated chains, siloxane chains, polyether chains and combinations thereof. Preferred surfactants are single chained double chained or poly chained. Preferred surfactants according to the invention have non-ionic, anionic, cationic, or zwitterionic heads. Preferred surfactants are polymeric and monomeric or a mixture thereof. Preferred surfactants according to the invention can have pigment affinic groups, preferably hydroxyfunctional carboxylic acid esters with pigment affinic groups (e.g., DISPERBYK®-108, manufactured by BYK USA, Inc.), acrylate copolymers with pigment affinic groups (e.g., DISPERBYK®-116, manufactured by BYK USA, Inc.), modified polyethers with pigment affinic groups (e.g., TEGO® DISPERS 655, manufactured by Evonik Tego Chemie GmbH), other surfactants with groups of high pigment affinity (e.g., TEGO® DISPERS 662 C, manufactured by Evonik Tego Chemie GmbH). Other preferred polymers according to the invention not in the above list are polyethyleneglycol and its derivatives, and alkyl carboxylic acids and their derivatives or salts, or mixtures thereof. The preferred polyethyleneglycol derivative according to the invention is poly(ethyleneglycol)acetic acid. Preferred alkyl carboxylic acids are those with fully saturated and those with singly or poly unsaturated alkyl chains or mixtures thereof. Preferred carboxylic acids with saturated alkyl chains are those with alkyl chains lengths in a range from about 8 to about 20 carbon atoms, preferably $C_9H_{19}COOH$ (capric acid), $C_{11}H_{23}COOH$ (Lauric acid), $C_{13}H_{27}COOH$ (myristic acid) $C_{15}H_{31}COOH$ (palmitic acid), $C_{17}H_{35}COOH$ (stearic acid) or mixtures thereof. Preferred carboxylic acids with unsaturated alkyl chains are $C_{18}H_{34}O_2$ (oleic acid) and $C_{18}H_{32}O_2$ (linoleic acid). The preferred monomeric surfactant according to the invention is benzotriazole and its derivatives. The surfactant may be present in an amount of about 0 to 10 weight % of organic vehicle, preferably about 0-8 wt. %, and more preferably about 0.01-6 wt. %.

Preferred additives in the organic vehicle are those additives which are distinct from the aforementioned vehicle components and which contribute to favorable properties of the electroconductive paste, such as advantageous viscosity, sintering, electrical conductivity of the produced electrode and good electrical contact with substrates. All additives known to the person skilled in the art, and which are considered to be suitable in the context of the invention, may be employed as additives in the organic vehicle. Preferred additives according to the invention are thixatropic agents, viscosity regulators, stabilizing agents, inorganic additives, thickeners, emulsifiers, dispersants or pH regulators. Preferred thixatropic agents in this context are carboxylic acid derivatives, preferably fatty acid derivatives or combinations thereof. Preferred fatty acid derivatives are $C_9H_{19}COOH$ (capric acid), $C_{11}H_{23}COOH$ (Lauric acid), $C_{13}H_{27}COOH$ (myristic acid), $C_{15}H_{31}COOH$ (palmitic acid), $C_{17}H_{35}COOH$ (stearic acid), $C_{18}H_{34}O_2$ (oleic acid), $C_{18}H_{32}O_2$ (linoleic acid), castor oil, or combinations thereof. A preferred combination comprising fatty acids in this context is castor oil. In order to facilitate printability of the electroconductive paste, it is preferred according to the invention that the viscosity of the electroconductive paste lies in a range from about 10 to about 30 Pa·s, preferably in a range from about 12 to about 25 Pa·s and most preferably in a range from about 15 to about 22 Pa·s.

In one embodiment, the organic vehicle is present in an amount of about 5-40 weight % of paste, more preferably about 5-30 wt. %, and most preferably about 5-15 wt. %.

Additives

Preferred additives in the context of the invention are constituents added to the electroconductive paste, in addition to the other constituents explicitly mentioned, which contribute to increased performance of the electroconductive paste, of the electrodes produced thereof, or of the resulting solar cell. All additives known to the person skilled in the art, and which are considered suitable in the context of the invention, may be employed as additives in the electroconductive paste. In addition to additives present in the IRS and in the vehicle, additives can also be present in the electroconductive paste. Preferred additives according to the invention are thixotropic agents, viscosity regulators, emulsifiers, stabilising agents or pH regulators, inorganic additives, thickeners and dispersants, or a combination of at least two thereof, whereas inorganic additives are most preferred. Preferred inorganic additives in this context according to the invention are Mg, Ni, Te, W, Zn, Mg, Gd, Ce, Zr, Ti, Mn, Sn, Ru, Co, Fe, Cu and Cr or a combination of at least two thereof, preferably Zn, Sb, Mn, Ni, W, Te and Ru, or a combination of at least two thereof, oxides thereof, compounds which can generate those metal oxides on firing, or a mixture of at least two of the aforementioned metals, a mixture of at least two of the aforementioned oxides, a mixture of at least two of the aforementioned compounds which can generate those metal oxides on firing, or mixtures of two or more of any of the above mentioned.

Forming the Electroconductive Paste Composition

To form the electroconductive paste composition, the IRS materials may be combined with the conductive metal component (e.g., silver) and the organic vehicle using any method known in the art for preparing a paste composition. The method of preparation is not critical, as long as it results in a homogenously dispersed paste. The components can be mixed, such as with a mixer, then passed through a three roll mill, for example, to make a dispersed uniform paste. In addition to mixing all of the components simultaneously, the inorganic reaction system material can be co-milled with the conductive metallic component in a ball mill for 2-24 hours to achieve a homogenous mixture of the inorganic reaction system and conductive metallic component particles, which may then combined with the organic vehicle in a mixer.

Solar Cells

In another aspect, the invention relates to a solar cell. In one embodiment, the solar cell comprises a semiconductor substrate (e.g., a silicon wafer) and an electroconductive paste composition according to any of the embodiments described herein.

In another aspect, the invention relates to a solar cell prepared by a process comprising applying an electroconductive paste composition according to any of the embodiments described herein to a semiconductor substrate (such as a silicon wafer) and firing the semiconductor substrate.

Silicon Wafer

Preferred wafers according to the invention are regions, among other regions of the solar cell, capable of absorbing light with high efficiency to yield electron-hole pairs and separating holes and electrons across a boundary with high efficiency, preferably across a so called p-n junction boundary. Preferred wafers according to the invention are those comprising a single body made up of a front doped layer and a back doped layer.

It is preferred for that wafer to consist of appropriately doped tetravalent elements, binary compounds, tertiary compounds or alloys. Preferred tetravalent elements in this context are Si, Ge or Sn, preferably Si. Preferred binary compounds are combinations of two or more tetravalent elements, binary compounds of a group III element with a group V element, binary com-pounds of a group II element with a group VI element or binary compounds of a group IV element with a group VI element. Preferred combinations of tetravalent elements are combinations of two or more elements selected from Si, Ge, Sn or C, preferably SiC. The preferred binary compounds of a group III element with a group V element is GaAs. It is most preferred according to the invention for the wafer to be based on Si. Si, as the most preferred material for the wafer, is referred to explicitly throughout the rest of this application. Sections of the following text in which Si is explicitly mentioned also apply for the other wafer compositions described above.

Where the front doped layer and back doped layer of the wafer meet is the p-n junction boundary. In an n-type solar cell, the back doped layer is doped with electron donating n-type dopant and the front doped layer is doped with electron accepting or hole donating p-type dopant. In a p-type solar cell, the back doped layer is doped with p-type dopant and the front doped layer is doped with n-type dopant. It is preferred according to the invention to prepare a wafer with a p-n junction boundary by first providing a doped Si substrate and then applying a doped layer of the opposite type to one face of that substrate.

Doped Si substrates are well known to the person skilled in the art. The doped Si substrate can be prepared in any way known to the person skilled in the art and which he considers to be suitable in the context of the invention. Preferred sources of Si substrates according to the invention are mono-crystalline Si, multi-crystalline Si, amorphous Si and upgraded metallurgical Si, mono-crystalline Si or multi-crystalline Si being most preferred. Doping to form the doped Si substrate can be carried out simultaneously by adding dopant during the preparation of the Si substrate or can be carried out in a subsequent step. Doping subsequent to the preparation of the Si substrate can be carried out for example by gas diffusion epitaxy. Doped Si substrates are also readily commercially available. According to the invention it is one option for the initial doping of the Si substrate to be carried out simultaneously to its formation by adding dopant to the Si mix. According to the invention it is one option for the application of the front doped layer and the highly doped back layer, if present, to be carried out by gas-phase epitaxy. This gas phase epitaxy is preferably carried out at a temperature in a range from about 500° C. to about 900° C., more preferably in a range from about 600° C. to about 800° C. and most preferably in a range from about 650° C. to about 750° C. at a pressure in a range from about 2 kPa to about 100 kPa, preferably in a range from about 10 to about 80 kPa, most preferably in a range from about 30 to about 70 kPa.

It is known to the person skilled in the art that Si substrates can exhibit a number of shapes, surface textures and sizes. The shape can be one of a number of different shapes including cuboid, disc, wafer and irregular polyhedron amongst others. The preferred shape according to the invention is wafer shaped where that wafer is a cuboid with two dimensions which are similar, preferably equal and a third dimension which is significantly less than the other two dimensions. Significantly less in this context is preferably at least a factor of about 100 smaller.

A variety of surface types are known to the person skilled in the art. According to the invention Si substrates with rough surfaces are preferred. One way to assess the roughness of the substrate is to evaluate the surface roughness parameter for a sub-surface of the substrate which is small in comparison to the total surface area of the substrate, preferably less than about one hundredth of the total surface area, and which is essentially planar. The value of the surface roughness parameter is given by the ratio of the area of the subsurface to the area of a theoretical surface formed by projecting that subsurface onto the flat plane best fitted to the subsurface by minimizing mean square displacement. A higher value of the surface roughness parameter indicates a rougher, more irregular surface and a lower value of the surface roughness parameter indicates a smoother, more even surface. According to the invention, the surface roughness of the Si substrate is preferably modified so as to produce an optimum balance between a number of factors including but not limited to light absorption and adhesion of fingers to the surface.

The two larger dimensions of the Si substrate can be varied to suit the application required of the resultant solar cell. It is preferred according to the invention for the thickness of the Si wa-fer to lie below about 0.5 mm more preferably below about 0.3 mm and most preferably below about 0.2 mm. Some wafers have a minimum size of 0.01 mm or more.

It is preferred according to the invention for the front doped layer to be thin in comparison to the back doped layer. It is preferred according to the invention for the front doped layer to have a thickness lying in a range from about 0.1 to about 10 μm, preferably in a range from about 0.1 to about 5 μm and most preferably in a range from about 0.1 to about 2 μm.

A highly doped layer can be applied to the back face of the Si substrate between the back doped layer and any further layers. Such a highly doped layer is of the same doping type as the back doped layer and such a layer is commonly denoted with a + (n+-type layers are applied to n-type back doped layers and p+-type layers are applied to p-type back doped layers). This highly doped back layer serves to assist metallization and improve electroconductive proper-ties at the substrate/electrode interface area. It is preferred according to the invention for the highly doped back layer, if present, to have a thickness in a range from about 1 to about 100 μm, preferably in a range from about 1 to about 50 μm and most preferably in a range from about 1 to about 15 μm.

Dopants

Preferred dopants are those which, when added to the Si wafer, form a p-n junction boundary by introducing electrons or holes into the band structure. It is preferred according to the invention that the identity and concentration of these dopants is specifically selected so as to tune the band structure profile of the p-n junction and set the light absorption and conductivity pro-files as required. Preferred p-type dopants according to the invention are those which add holes to the Si wafer band structure. They are well known to the person skilled in the art. All dopants known to the person skilled in the art and which he considers to be suitable in the context of the invention can be employed as p-type dopant. Preferred p-type dopants according to the invention are trivalent elements, particularly those of group 13 of the periodic table. Preferred group 13 elements of the periodic table in this context include but are not limited to B, Al, Ga, In, Tl or a combination of at least two thereof, wherein B is particularly preferred.

Preferred n-type dopants according to the invention are those which add electrons to the Si wafer band structure. They are well known to the person skilled in the art. All dopants known to the person skilled in the art and which he considers to be suitable in the context of the invention can be employed as n-type dopant. Preferred n-type dopants according to the invention are elements of group 15 of the periodic table. Preferred group 15 elements of the periodic table in this context include N, P, As, Sb, Bi or a combination of at least two thereof, wherein P is particularly preferred.

As described above, the various doping levels of the p-n junction can be varied so as to tune the desired properties of the resulting solar cell.

In certain embodiments, the semiconductor substrate (i.e., silicon wafer) exhibits a sheet resistance above about 60Ω/□, such as above about 65Ω/□, above about 70Ω/□, above about 90Ω/□ or above about 95Ω/□.

A contribution to achieving at least one of the above described objects is made by a solar cell obtainable by a process according to the invention. Preferred solar cells according to the invention are those which have a high efficiency in terms of proportion of total energy of incident light converted into electrical energy output and which are light and durable.

Figure 2:
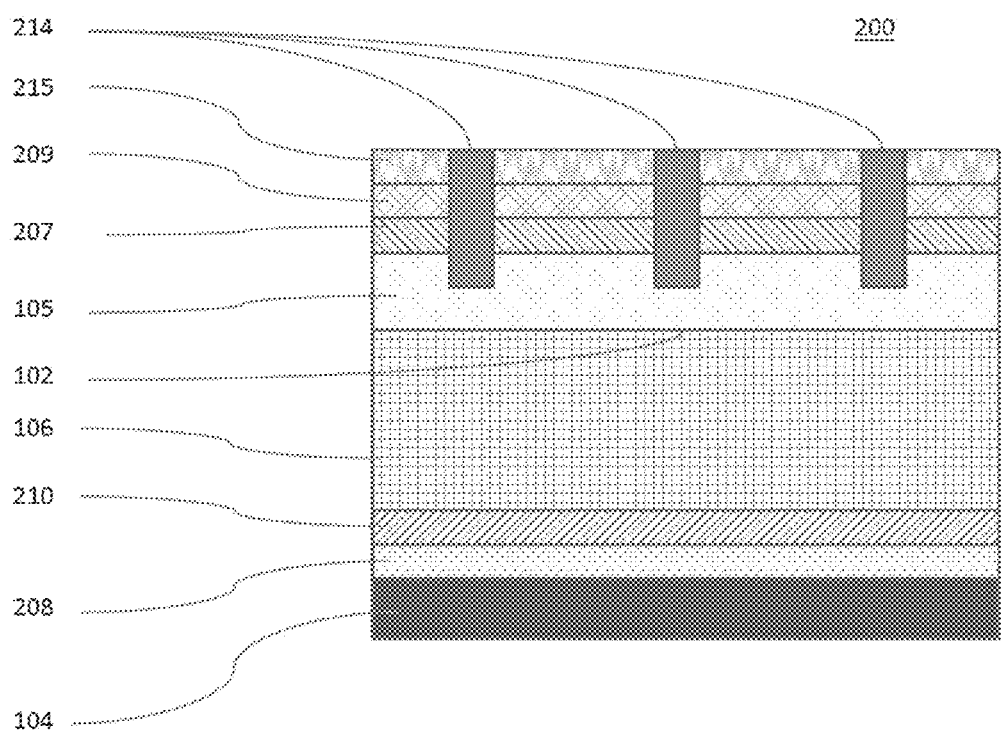
FIG. 2 is a cross-sectional view of the solar cell of FIG. 1 having protective layers printed thereon in accordance with an exemplary embodiment of the invention.

The common configuration of a solar cell according to the invention (excluding layers which are purely for chemical and mechanical protection) is as depicted in FIG. 2. As depicted in FIG. 2, the solar cell 200 comprises a back electrode 104, a back passivation layer 208, a highly doped back layer 210, a back doped layer 106, a p-n junction boundary 102, a front doped layer 105, a front passivation layer 207, an anti-reflection layer 209, front electrode fingers 214 and front electrode bus bars 215, wherein the front electrode fingers penetrate through the anti-reflection layer 209 and the front passivation layer 207, into the front doped layer 105, far enough to form electrical contact with the front doped layer 105, but not so far as to shunt the p-n junction boundary 102. Individual layers can be omitted from this common layer configuration or individual layers can indeed perform the function of more than one of the layers described in the common embodiment outlined above. In one embodiment of the invention, a single layer acts as both antireflective layer and passivation layer.

The minimum required layer configuration is given in FIG. 1. The solar cell 100, at a minimum, comprises a back electrode 104, a back-doped layer 106, a p-n junction boundary 102, a front-doped layer 105 and front electrodes 103, wherein the front electrodes penetrate into the front-doped layer 105 enough to form electrical contact therewith. The back doped layer 106 and the front doped layer 105 together constitute a single doped Si wafer 101. In the case that solar cell 100 represents a p-type cell, the back electrode 104 is preferably a mixed silver and aluminium electrode, the back doped layer 106 is preferably Si lightly doped with boron, the front doped layer 105 is preferably Si-heavily doped with phosphorus, and the front electrode 103 is preferably a silver electrode. The front electrode 103 has been represented in FIG. 1 as consisting of three bodies purely to illustrate schematically the fact that the front electrode 103 does not cover the front face in its entirety. The invention does not limit the front electrode 103 to those consisting of three bodies.

Antireflective Layer

According to the invention, an antireflective layer can be applied as the outer layer before the electrode is applied to the front face of the solar cell. Preferred antireflective layers according to the invention are those which decrease the proportion of incident light reflected by the front face and increase the proportion of incident light crossing the front face to be absorbed by the wafer. Antireflective layers which give rise to a favourable absorption/reflection ratio, are susceptible to etching by the employed electroconductive paste but are otherwise resistant to the temperatures required for firing of the electroconductive paste, and do not contribute to increased recombination of electrons and holes in the vicinity of the electrode interface are favoured. All antireflective layers known to the person skilled in the art and which he considers to be suitable in the context of the invention can be employed. Preferred antireflective layers according to the invention are $SiN_x$, $SiO_2$, $Al_2O_3$, $TiO_2$ or mixtures of at least two thereof and/or combinations of at least two layers thereof, wherein $SiN_x$ is particularly preferred, in particular where an Si wafer is employed.

The thickness of antireflective layers is suited to the wavelength of the appropriate light. According to the invention it is preferred for antireflective layers to have a thickness in a range from about 20 to about 300 nm, more preferably in a range from about 40 to about 200 nm and most preferably in a range from about 60 to about 90 nm.

Passivation Layers

According to the invention, one or more passivation layers can be applied to the front and/or back side of the silicon wafer as an outer layer, before the electrode, or before the anti-reflection layer if one is present, is applied. Preferred passivation layers are those which reduce the rate of electron/hole recombination in the vicinity of the electrode interface. Any passivation layer which is known to the person skilled in the art and which he considers to be suitable in the context of the invention can be employed. Preferred passivation layers according to the invention are silicon nitride, silicon dioxide and titanium dioxide, silicon nitride being most preferred. According to the invention, it is preferred for the passivation layer to have a thickness in a range from about 0.1 nm to about 2 μm, more preferably in a range from about 10 nm to about 1 μm and most preferably in a range from about 30 nm to about 200 nm.

Additional Protective Layers

In addition to the layers described above which directly contribute to the principle function of the solar cell, further layers can be added for mechanical and chemical protection.

The cell can be encapsulated to provide chemical protection. Encapsulations are well known to the person skilled in the art and any encapsulation can be employed which is known to him and which he considers suitable in the context of the invention. According to the invention, transparent polymers, often referred to as transparent thermoplastic resins, are preferred as the encapsulation material, if such an encapsulation is present. Preferred transparent polymers in this context are for example silicon rubber and polyethylene vinyl acetate (PVA).

A transparent glass sheet can be added to the front of the solar cell to provide mechanical protection to the front face of the cell. Transparent glass sheets are well known to the person skilled in the art and any transparent glass sheet known to him and which he considers to be suitable in the context of the invention can be employed as protection on the front face of the solar cell.

A back protecting material can be added to the back face of the solar cell to provide mechanical protection. Back protecting materials are well known to the person skilled in the art and any back protecting material which is known to the person skilled in the art and which he considers to be suitable in the context of the invention can be employed as protection on the back face of the solar cell. Preferred back protecting materials according to the invention are those having good mechanical properties and weather resistance. The preferred back protection materials according to the invention is polyethylene terephthalate with a layer of polyvinyl fluoride. It is preferred according to the invention for the back protecting material to be present underneath the encapsulation layer (in the event that both a back protection layer and encapsulation are present).

A frame material can be added to the outside of the solar cell to give mechanical support. Frame materials are well known to the person skilled in the art and any frame material known to the person skilled in the art and which he considers suitable in the context of the invention can be employed as frame material. The preferred frame material according to the invention is aluminium.

Method of Preparing Solar Cell

In one embodiment, the solar cell may be prepared by applying an electroconductive paste composition to an antireflective coating (ARC), such as silicon nitride, silicon oxide, titanium oxide or aluminum oxide, on a semiconductor substrate, such as a silicon wafer (e.g., by a screen printing process), then firing the semiconductor substrate to form an electrode on the substrate.

In one embodiment, the electroconductive paste is applied to the light receiving surface of the semiconductor substrate (e.g., silicon wafer). However, the foregoing does not preclude incorporating an inorganic reaction system in an electroconductive paste composition intended for the backside of a silicon wafer. The electroconductive paste can be applied in any manner known to the person skilled in that art and which he considers suitable in the context of the invention including but not limited to impregnation, dipping, pouring, dripping on, injection, spraying, knife coating, curtain coating, brushing or printing or a combination of at least two thereof, wherein preferred printing techniques are ink-jet printing, screen printing, tampon printing, offset printing, relief printing or stencil printing or a combination of at least two thereof. It is preferred according to the invention that the electroconductive paste is applied by printing, preferably by screen printing. It is preferred according to the invention that the screens have mesh opening with a diameter in a range from about 20 to about 100 μm, more preferably in a range from about 30 to about 80 μm, and most preferably in a range from about 40 to about 70 μm.

It is preferred according to the invention for electrodes to be formed by first applying an electroconductive paste and then firing said electroconductive paste to yield a solid electrode body. Firing is well known to the person skilled in the art and can be effected in any manner known, and which is considered suitable in the context of the invention. It is preferred in the context of the invention that firing be carried out above the glass transition temperature of the IRS materials.

According to the invention, the maximum temperature set for the firing is below about 900° C., preferably below about 860° C. Firing temperatures as low as about 820° C. have been employed for obtaining solar cells. The firing temperature profile is typically set so as to enable the burnout of organic binder materials from the electroconductive paste composition, as well as any other organic materials present. The firing step is typically carried out in air or in an oxygen-containing atmosphere in a belt furnace. It is preferred according to the invention for firing to be carried out in a fast firing process with a total firing time in the range from about 30 s to about 3 minutes, more preferably in the range from about 30 s to about 2 minutes and most preferably in the range from about 40 s to about 1 minute. The time above 600° C. is most preferably in a range from about 3 to 7 s. The substrate may reach a peak temperature in the range of about 700 to 900° C. for a period of about 1 to 5 seconds. The firing may also be conducted at high transport rates, for example, about 100-500 cm/min, with resulting hold-up times of about 0.05 to 5 minutes. Multiple temperature zones, for example 3-11 zones, can be used to control the desired thermal profile.

Firing of electroconductive pastes on the front and back faces can be carried out simultaneously or sequentially. Simultaneous firing is appropriate if the electroconductive pastes applied to both faces have similar, preferably identical, optimum firing conditions. Where appropriate, it is preferred according to the invention for firing to be carried out simultaneously. Where firing is carried out sequentially, it is preferable according to the invention for the back electroconductive paste to be applied and fired first, followed by application and firing of the electroconductive paste to the front face.

Figure 3A:
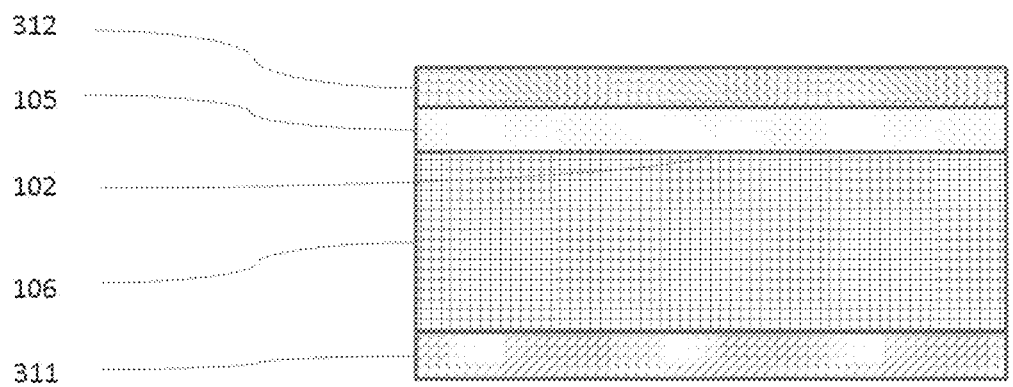
FIG. 3A is a cross-sectional view of a doped silicon wafer used to produce a solar cell according to an exemplary embodiment of the invention.
Figure 3B:
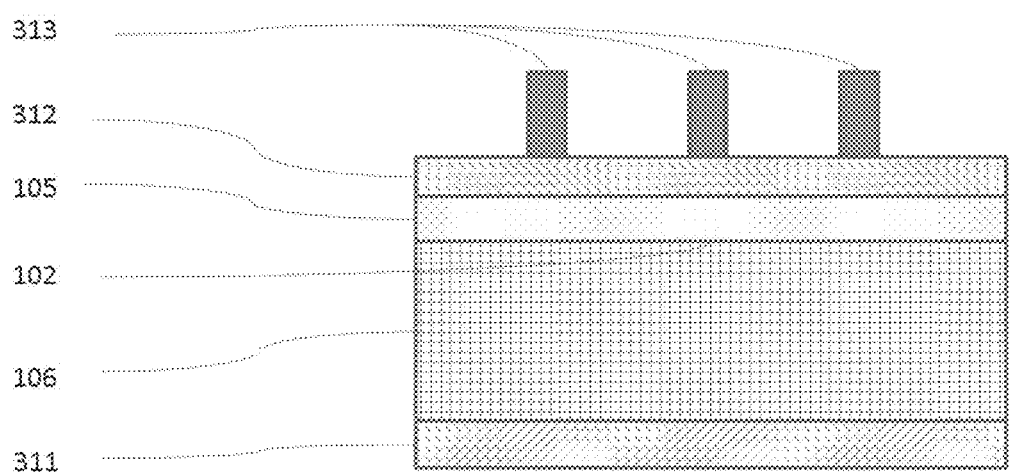
FIG. 3B is a cross-sectional view of the doped silicon wafer of FIG. 3A having an electroconductive paste according to an exemplary embodiment of the invention printed thereon.
Figure 3C:
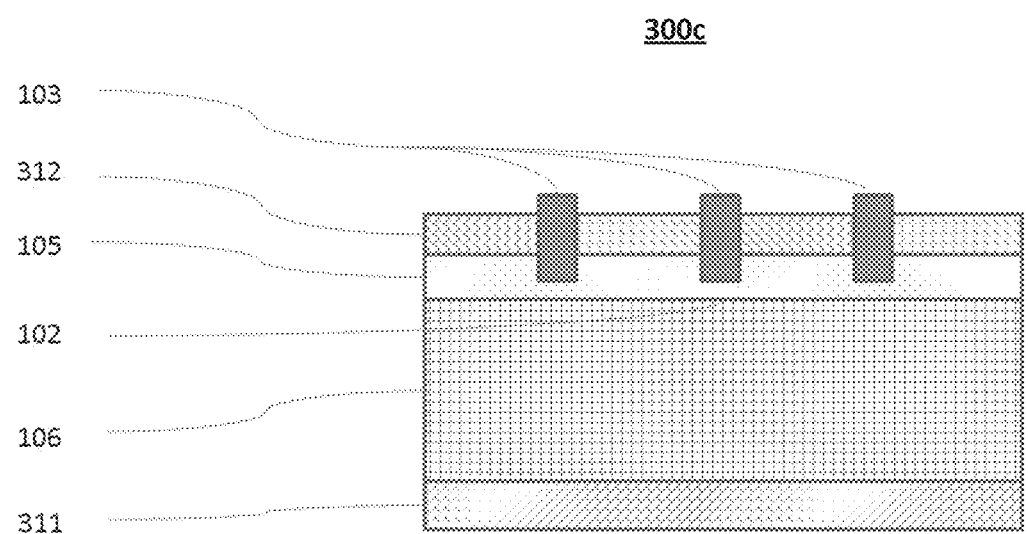
FIG. 3C is a cross-sectional view of the doped silicon wafer of FIG. 3B having a front electrode applied thereon according to an exemplary embodiment of the invention.

FIGS. 3A, 3B and 3C together illustrate the process of firing a front side paste to yield a front side electrode. FIGS. 3A, 3B and 3C are schematic and generalized and additional layers further to those constituting the p-n junction are considered simply as optional additional layers without more detailed consideration.

FIG. 3A illustrates a wafer before application of front electrode, 300a. Starting from the back face and continuing towards the front face the wafer before application of front electrode 300a optionally comprises additional layers on the back face 311, a back doped layer 106, a p-n junction boundary 102, a front doped layer 105 and additional layers on the front face 312. The additional layers on the back face 311 can comprise any of a back electrode, a back passivation layer, a highly doped back layer or none of the above. The additional layer on the front face 312 can comprise any of a front passivation layer, an anti-reflection layer or none of the above.

FIG. 3B shows a wafer with electroconductive paste applied to the front face before firing 300b. In addition to the layers present in 300a described above, an electroconductive paste 313 is present on the surface of the front face.

FIG. 3C shows a wafer with front electrode applied 300c. In addition to the layers present in 300a described above, a front side electrode 103 is present which penetrates from the surface of the front face through the additional front layers 312 and into the front doped layer 105 and is formed from the electroconductive paste 313 of FIG. 3B by firing.

In FIGS. 3B and 3C, the applied electroconductive paste 313 and the front electrodes 103 are shown schematically as being present as three bodies. This is purely a schematic way of representing a non-complete coverage of the front face by the paste/electrodes and the invention does not limit the paste/electrodes to being present as three bodies.

Solar Cell Module

A contribution to achieving at least one of the above mentioned objects is made by a module comprising at least one solar cell obtained as described above, in particular according to at least one of the above described embodiments. A multiplicity of solar cells according to the invention can be arranged spatially and electrically connected to form a collective arrangement called a module. Preferred modules according to the invention can take a number of forms, preferably a rectangular surface known as a solar panel. A large variety of ways to electrically connect solar cells, as well as a large variety of ways to mechanically arrange and fix such cells to form collective arrangements, are well known to the person skilled in the art. Any such methods known by one skilled in the art, and which are considered suitable in the context of the invention, may be employed. Preferred methods according to the invention are those which result in a low mass to power output ratio, low volume to power output ration, and high durability. Aluminum is the preferred material for mechanical fixing of solar cells according to the invention.

EXAMPLE 1

As shown in Table 1, a first exemplary paste (referred to as 35C) was prepared with an IRS containing 4.6 wt. % (of paste) of a first leaded glass frit containing overall 67.4% PbO and 0.5 wt. % (of paste) elemental tellurium additive. Silver particles, in an amount of about 85 wt. % (of paste), and an organic vehicle, in an amount of about 1-15 wt. % (of paste), were added to form the 35C exemplary paste. Reference Paste 1 with the same glass frit, but without elemental tellurium, was prepared as a control.

The resulting exemplary and reference solar cells were prepared by the above-referenced process. The paste was screen printed onto a solar cell wafer at a speed of 150 mm/s, using a 325 (mesh)*0.9 (mil, wire diameter)*0.6 (mil, emulsion thickness)*70 µm (finger line opening) calendar screen. The printed wafer was dried at 150° C. and then fired at a profile with the peak temperature of about 750-900° C. for a few seconds in a linear multi-zone infrared furnace.

EXAMPLE 2

As shown in Table 1, a second exemplary paste (referred to as 35D), was prepared with an IRS containing 4.7 wt. % (of paste) of a second leaded glass frit containing overall 64.04% PbO and 0.5 wt. % (of paste) elemental tellurium additive. Silver particles, in an amount of about 85 wt. % (of paste), and an organic vehicle, in an amount of about 1-15 wt. % (of paste), were added to form the 35D exemplary paste. Reference Paste 2 with the same glass frit, but without elemental tellurium, was prepared as a control. The resulting exemplary and reference solar cells were prepared using the process set forth in Example 1 above.

EXAMPLE 3

A third exemplary paste (referred to as 37B) was prepared with an IRS containing 3.1 wt. % (of paste) of the first leaded glass frit containing overall 46.51% PbO of IRS and 1.2 wt. % (of paste) elemental tellurium additive. A comparative paste (referred to as 33i) was prepared with 3.1 wt. % (of paste) leaded glass frit containing overall 64.52% PbO of IRS. Comparative paste 33i does not contain elemental tellurium. Silver particles, in an amount of about 85 wt. % (of paste), and an organic vehicle, in an amount of about 1-15 wt. % (of paste), were added to form the 37B and 33i pastes. The resulting exemplary and comparative solar cells were prepared using the process set forth in Example 1 above.

EXAMPLE 4

Another exemplary paste (referred to as 33A in Table 1) was prepared with an IRS containing 3.1 wt. % (of paste) of lead containing glass frit containing overall 58.82% PbO of IRS and 0.3 wt. % (of paste) elemental tellurium additive. A comparative paste (referred to as 33J in Table 1) was prepared with an IRS comprising 3.1 wt. % (of paste) lead containing glass frit containing overall 57.55% PbO of IRS with 0.375 wt. % (of paste) tellurium dioxide additive. The 33A and 33J pastes were prepared to demonstrate the effect of including elemental tellurium as an additive as opposed to tellurium dioxide as an additive. Further, the amount of tellurium dioxide used in the comparative 33J paste (0.375 wt. %) provides the same amount (mole) of tellurium as the elemental tellurium used in the 33A paste (0.3 wt. %).

Silver particles, in an amount of about 85 wt. % (of paste), and an organic vehicle, in an amount of about 1-15 wt. % (of paste), were added to form the 33A and 33J exemplary and comparative pastes. The resulting exemplary and comparative solar cells were prepared using the process set forth in Example 1 above.

EXAMPLE 5

All of the exemplary solar pastes were then printed onto the front side of lightly doped p-type silicon wafers having a sheet resistance of 90Ω/□, an aluminum back side paste is also applied to the back side of the silicon wafers, and then dried and fired according to the process outlined in Example 1 above. All solar cells were then tested using an I-V tester. Xe arc lamp in the I-V tester was used to simulate sunlight with a known intensity and the front surface of the solar cell was irradiated to generate the I-V curve. Using this curve, various parameters common to this measurement method which provide for electrical performance comparison were determined, including efficiency (Eff), fill factor (FF), series resistance (Rs), series resistance under three standard lighting intensities (Rs3), and contact resistance (Rc). All data for the reference and control pastes was normalized to 1. The relevant data for the experimental pastes was calculated by dividing the appropriate measurement by the normalized reference cell data. All data is compiled in Table 2 and Table 3.

The electrical performance data from the solar cells made with the 35C and 35D pastes was then compared to the electrical performance data from the solar cells made with Reference Pastes 1 and 2, respectively. Further, the performance data from the solar cells made with the 33i, 37B, and 33J pastes was compared to the performance data from the solar cell made with the 33A paste. The 33A paste was used as the reference paste in order to ascertain the effect of removing the elemental tellurium additive (as in the 33i paste), increasing the amount of the elemental tellurium additive (as in the 37B paste), or replacing the elemental tellurium additive with tellurium dioxide (as in the 33J paste).

TABLE 1

IRS Compositions of Tested Pastes

| IRS Formulation | Example 1 | | Example 2 | | Example 3 | | Example 4 | |
| --- | --- | --- | --- | --- | --- | --- | --- | --- |
| | Reference Paste 1 | 35C | Reference Paste 2 | 35D | 33i | 37B | 33A | 33J |
| Leaded Glass Frit 1 | 4.6 | 4.6 | | | 3.1 | 3.1 | 3.1 | 3.1 |
| Leaded Glass Frit 2 | | | 4.7 | 4.7 | | | | |
| Elemental Tellurium Additive | | 0.5 | | 0.5 | | 1.2 | 0.3 | |
| Tellurium Dioxide Additive | | | | | | | | 0.375 |
| PbO wt. % in IRS | 67.40% | 60.80% | 70.85% | 64.04% | 64.52% | 46.51% | 58.82% | 57.55% |

TABLE 2

Electrical Performance of Tested Pastes in Examples 1, 3, and 4

| | Example 1 | | Example 3 | | Example 4 | |
| --- | --- | --- | --- | --- | --- | --- |
| | Reference Paste 1 | 35C | 33i | 37B | 33A | 33J |
| Eff | 1.00 | 1.34 | 0.18 | 1.04 | 1.00 | 0.93 |
| FF | 1.00 | 1.36 | 0.55* | 1.05 | 1.00 | 0.94 |
| Rs | 1.00 | 0.42 | 11.98 | 0.73 | 1.00 | 1.18 |
| Rs3 | 1.00 | 0.20 | 15.38 | 0.60 | 1.00 | 1.51 |
| Rc | 1.00 | 0.11 | 4.87 | 0.43 | 1.00 | 1.76 |

*Fill factor < 40% was not provided by H.A.L.M IV tester, so it was calculated with the equation $FF = I_{mp} \times V_{mp}/I_{sc} \times V_{oc}$

TABLE 3

Electrical Performance of Tested Pastes in Example 2

| | Example 2 | |
| --- | --- | --- |
| | Reference Paste 2 | 35D |
| Eff | 1.00 | 1.30 |
| FF | 1.00 | 1.32 |
| Rs | 1.00 | 0.53 |
| Rs3 | 1.00 | 0.27 |
| Rc | 1.00 | 0.19 |

Reference Paste 1 comprises a leaded glass frit containing 67.40% PbO. Reference Paste 2 comprises a leaded glass frit containing 70.85% PbO. The 33i paste comprises a leaded glass frit containing 64.52% PbO. As shown in the results listed in Tables 2 and 3, the exemplary pastes (35C and 35D) exhibited drastic increases in Eff and FF, and substantial decreases in Rs and Rs3. The reference pastes are known to provide excellent conductivity and overall solar cell efficiency. Thus, because the exemplary pastes showed electrical performance superior to the reference pastes, they are even more favorable for use in solar cell technology.

Further, the 33J paste, which comprised lead oxide and tellurium dioxide, was compared to the 33A paste, which comprised lead oxide and elemental tellurium. The electrical performance data for the 33A paste was normalized to 1, in order to show the effect of removing the elemental tellurium additive and replacing it with tellurium dioxide. The 33J paste exhibited decreased Eff and FF, and increased Rs, Rs3 and Rc as compared to the 33A paste. Thus, the inclusion of tellurium dioxide (as opposed to elemental tellurium) resulted in pastes with decreased electrical properties. This shows that elemental tellurium was not introduced as an equivalent or precursor of tellurium dioxide, but it functions through a novel metal-semiconductor contact forming mechanism. Further analysis also shows that there is no tellurium oxide detected via X-ray diffraction analysis in either fired or dried pastes. It is thus apparent that the beneficial effects of the elemental tellurium additive cannot be replicated using tellurium oxide.

Furthermore, the 33i paste, which did not have any elemental tellurium additive, showed the most extreme results. Its Eff and FF were remarkably lower than the 33A paste, and its Rs and Rs3 were drastically higher than the 33A paste. Thus, the addition of the elemental tellurium significantly improved the paste's electrical performance.

EXAMPLE 6

To verify that an elemental tellurium additive stays in its elemental form during drying and firing, two IRS compositions with elemental tellurium were prepared and underwent x-ray diffraction testing.

As set forth in Table 4, a first IRS composition (referred to as 65A) was prepared with lead containing glass frit containing 64.52% PbO in IRS, and no elemental tellurium additive. A second IRS composition (referred to as 65B) was prepared with lead containing glass frit containing 58.82% PbO in IRS, and 0.3 wt. % (of paste) elemental tellurium additive. A third IRS composition (referred to as 65C), was also prepared with lead containing glass frit containing 46.51% PbO in IRS, but the amount of elemental tellurium additive was increased to 1.2 wt. % (of paste). For comparison, one IRS composition (referred to as 65D) was prepared with lead containing glass frit containing overall 43.48% PbO and 1.5 wt. % (of paste) tellurium dioxide.

TABLE 4

IRS Compositions Tested Using X-Ray Diffraction

| IRS Formulation | 65A | 65B | 65C | 65D |
| --- | --- | --- | --- | --- |
| Leaded Glass Frit 1 | 3.1 | 3.1 | 3.1 | 3.1 |
| Elemental Tellurium | | 0.3 | 1.2 | |
| Tellurium Oxide | | | | 1.5 |
| PbO wt. % in IRS | 64.52 | 58.82 | 46.51 | 43.48 |

The IRS compositions (65A-D) were dried and fired at the temperature and duration typically used for manufacturing a solar cell (Example 1). The dried and fired IRS compositions are then subjected to x-ray powder diffraction analysis. The raw components of IRS were mixed with an organic vehicle described herein at a weight ratio of 2:1 (IRS:vehicle) to form an IRS paste. All IRS paste samples were printed on regular c-Silicon wafer as a 2×2 $cm^2$ area. The wafers were dried and fired through the belt furnace using the same firing profile that was used in Example 1. Then, the wafers with the IRS film were cut to a suitable size for XRD analysis.

Using a Rigaku MiniFlux instrument, an x-ray diffraction analysis was conducted on all sample IRS compositions at a wavelength of Cu $\kappa_B \lambda = 1.5418$ Å with scan rate of 0.45 deg/min, 0.02 degree/step, from 10 degree to 60 degree. The standard of error was $2\theta$ is ±0.2 degree, which includes the error from diffractometer and sample preparation. Because the IRS compositions tested were so complex, the Inorganic Crystal Structure Database (ICSD) could not match the resulting patterns to any known crystal structures. However, because the compositions were fully known, their x-ray diffraction patterns could be manually created. The IRS compositions comprise amorphous glass and inorganic additive, such as elemental tellurium or tellurium oxide. Those additives all have known crystal structures. Therefore, based on those crystal structures, their XRD patterns were manually created by visualization software that is part of the ICSD. These manual patterns were then compared to the actual x-ray diffraction results to determine whether tellurium dioxide was present in the dried and fired IRS compositions. Table 5 compiles the x-ray diffraction data obtained from the testing.

TABLE 5

X-Ray Diffraction Data of Exemplary IRS Compositions

| Paste | 2-theta (deg) | Normalized Intensity |
| --- | --- | --- |
| 65A, dried | 29.49(4) | 38.7% |
| | 31.890(18) | 52.8% |
| | 34.569(12) | 55.7% |
| | 36.375(10) | 100.0% |
| | 56.737(17) | 42.5% |
| 65A, fired | 21.868(17) | 58.0% |
| | 22.368(13) | 28.0% |
| | 28.22(4) | 22.0% |
| | 29.67(2) | 24.0% |
| | 30.532(10) | 40.0% |
| | 31.233(5) | 97.0% |
| | 31.747(14) | 100.0% |
| | 34.457(14) | 16.0% |
| | 35.67(5) | 14.0% |
| | 36.236(11) | 78.0% |
| | 52.190(6) | 73.0% |
| | 56.554(16) | 24.0% |
| 65B, dried | 23.00(3) | 36.4% |
| | 27.536(15) | 75.5% |
| | 28.58(14) | 17.3% |
| | 31.73(2) | 48.2% |
| | 34.386(13) | 54.5% |
| | 36.222(11) | 100.0% |
| | 38.4071 | 17.7% |
| | 40.39(2) | 49.1% |
| | 43.5398 | 16.6% |
| | 47.6991 | 25.3% |
| | 49.7345 | 19.1% |
| | 56.559(19) | 32.7% |
| 65B, fired | 22.14 | 69.7% |
| | 22.74 | 83.9% |
| | 27.68 | 100.0% |
| | 29.36 | 80.4% |
| | 30.16 | 46.6% |
| | 31.36 | 42.8% |
| | 34.42 | 38.9% |
| | 39.54 | 38.7% |
| 65C, dried | 23.124(9) | 55.7% |
| | 27.660(5) | 100.0% |
| | 32 | 12.5% |
| | 34.53(2) | 13.1% |
| | 36.344(13) | 24.2% |
| | 38.38(2) | 18.0% |
| | 40.550(11) | 95.2% |
| | 43.45(4) | 14.6% |
| | 47.18(2) | 17.0% |
| | 49.711(12) | 29.2% |
| | 51.25(10) | 4.3% |
| | 56.665(13) | 8.4% |
| | 56.921(19) | 10.7% |
| 65C, fired | 28.29(6) | 44.2% |
| | 38.299(8) | 100.0% |
| | 44.60(4) | 10.9% |
| 65D, dried | 21.979(16) | 5.1% |
| | 26.327(4) | 100.0% |
| | 28.584(6) | 24.4% |
| | 28.84(2) | 13.4% |
| | 30.054(5) | 94.7% |
| | 32.01(19) | 1.3% |
| | 34.553(16) | 5.3% |
| | 36.370(12) | 11.0% |
| | 37.457(12) | 9.8% |
| | 44.22(18) | 0.9% |
| | 47.91(2) | 5.1% |
| | 48.691(10) | 36.7% |
| | 53.993(9) | 9.8% |
| | 55.411(7) | 18.7% |
| | 56.77(4) | 2.9% |
| 65D, fired | 27.670(17) | 100% |

In Table 6, characteristic x-ray diffraction peaks of elemental tellurium are set forth and compared to the peaks for each dried and fired paste. In Table 7, characteristic x-ray diffraction peaks of tellurium dioxide peaks are set forth and compared to the peaks for each dried and fired paste. When a characteristic peak is observed in a paste sample, it is marked with "+". If the peak is absent, it is marked with "−". All comparison is performed based on ±0.3 degree 2θ.

IRS composition 65A does not include elemental tellurium or tellurium oxide additives. Accordingly, in the dried and fired 65A samples, characteristic peaks of elemental tellurium and tellurium oxides cannot be observed. IRS compositions 65B and 65C comprise elemental tellurium. In the dried samples of 65B and 65C, most of the characteristic peaks of elemental tellurium can be observed. After firing, IRS compositions 65B and 65C still show some peaks indicative of elemental tellurium. IRS composition 65D comprises tellurium oxide. In the dried sample of 65B, characteristic peaks of tellurium oxide can be readily observed. After firing, the characteristic peaks of tellurium oxide are no longer observable. In general, the fired 65D sample is rather featureless, indicating lack of crystallinity of the fired 65D IRS composition. In contrast, IRS compositions with elemental tellurium additive (65B and 65C) shows characteristic peaks absent in the fired 65D IRS sample (Table 5), which leads to the conclusion that IRS compositions with elemental tellurium additive are different from with tellurium oxide additive.

EXAMPLE 7

Additional exemplary pastes made from varying amounts of leaded glass frits, all having differing amounts of PbO, as well as varying amounts of elemental tellurium additive were prepared. Solar cells were prepared using the process set forth in Example 1 above. The cells' electrical performance was then tested according to the process set forth in Example 5 above. In Tables 8 and 10, compositions of various exemplary pastes are set forth. In Tables 9 and 11, the electrical performance of these exemplary pastes was compared to the electrical performance of a reference paste, which was normalized to 1. In Table 9, the electrical performance data is normalized against 33A, and in Table 11, the electrical performance data is normalized against Reference Paste 1 (from Example 1). Compared to paste 33i, which does not include any elemental tellurium additive, the pastes with elemental tellurium additives in Tables 8 all showed marked improvements in Eff, FF, Rs, Rs3, and Rc measurements. The performance improvements can also be observed for the pastes shown in Table 10 as compared to reference paste 1.

TABLE 6

X-Ray Diffraction Peaks of Elemental Tellurium as Compared to Exemplary IRS Compositions

| 2-θ (deg) | Normalized Intensity | 65A, dried | 65A, fired | 65B, dried | 65B, fired | 65C, dried | 65C, fired | 65D, dried | 65D, fired |
|---|---|---|---|---|---|---|---|---|---|
| 23.02 | 16.6% | − | − | + | + | + | + | − | − |
| 27.56 | 100.0% | − | − | + | + | + | − | − | + |
| 38.24 | 33.8% | − | − | + | − | + | + | − | − |
| 40.42 | 19.5% | − | − | + | − | + | − | − | − |
| 43.32 | 16.4% | − | − | + | − | + | − | − | − |
| 45.88 | 7.2% | − | − | − | − | − | − | − | − |
| 47.02 | 4.9% | − | − | + | − | + | − | − | − |
| 49.62 | 14.9% | − | − | + | − | + | − | − | − |
| 51.2 | 6.4% | − | − | − | − | + | − | − | − |
| 51.94 | 2.6% | − | − | − | − | − | − | − | − |
| 56.86 | 9.9% | + | − | + | − | + | − | + | − |

TABLE 7

X-Ray Diffraction Peaks of Tellurium Dioxide as Compared to Exemplary IRS Compositions

| 2-θ (deg) | Normalized Intensity | 65A, dried | 65A, fired | 65B, dried | 65B, fired | 65C, dried | 65C, fired | 65D, dried | 65D, fired |
|---|---|---|---|---|---|---|---|---|---|
| 21.84 | 8.3% | − | + | − | − | − | − | + | − |
| 26.18 | 79.3% | − | − | − | − | − | − | + | − |
| 28.32 | 12.3% | − | + | − | − | − | + | − | − |
| 29.9 | 100.0% | − | − | − | − | − | − | + | − |
| 35.36 | 1.2% | − | − | − | − | − | − | − | − |
| 37.36 | 7.2% | − | − | − | − | − | − | + | − |
| 39.26 | 1.7% | − | − | − | − | − | − | − | − |
| 41.96 | 1.4% | − | − | − | − | − | − | − | − |
| 43.7 | 4.4% | − | − | + | − | − | − | − | − |
| 44.52 | 0.8% | − | − | − | − | − | + | − | − |
| 47.02 | 20.3% | − | − | − | − | + | − | − | − |
| 47.74 | 8.1% | − | − | + | − | − | − | + | − |
| 48.58 | 59.9% | − | − | − | − | − | − | + | − |
| 53.86 | 9.7% | − | − | − | − | − | − | + | − |
| 55.26 | 21.5% | − | − | − | − | − | − | + | − |
| 56 | 3.4% | − | − | − | − | − | − | − | − |
| 58.8 | 3.1% | − | − | − | − | − | − | − | − |

TABLE 8

Compositions of Exemplary Leaded Pastes with Elemental Tellurium Additive

| IRS Formulation | 33i | 33A | 36A | 36B | 37A | 37B | 37C | 36C | 36D | 36E | 36F | 36G | 36H |
|---|---|---|---|---|---|---|---|---|---|---|---|---|---|
| Leaded Glass Frit | 3.1 | 3.1 | 3.1 | 3.1 | 3.1 | 3.1 | 3.1 | 4.1 | 4.1 | 4.1 | 4.6 | 4.6 | 4.6 |
| Elemental Te |  | 0.3 | 0.5 | 0.7 | 0.9 | 1.2 | 1.5 | 0.3 | 0.5 | 0.7 | 0.3 | 0.5 | 0.7 |
| Lead Oxide % in IRS | 64.52% | 58.82% | 55.56% | 52.63% | 50.00% | 46.51% | 43.48% | 63.64% | 60.87% | 58.33% | 63.27% | 60.78% | 58.49% |

TABLE 9

Electrical Performance Data of Exemplary Leaded Pastes as Compared to 33A Paste

|  | 33i | 33A | 36A | 36B | 37A | 37B | 37C | 36C | 36D | 36E | 36F | 36G | 36H |
|---|---|---|---|---|---|---|---|---|---|---|---|---|---|
| Eff | 0.18 | 1.00 | 1.04 | 1.05 | 1.05 | 1.04 | 1.05 | 1.02 | 1.03 | 1.01 | 1.01 | 1.04 | 1.04 |
| FF | 0.42* | 1.00 | 1.04 | 1.05 | 1.06 | 1.05 | 1.06 | 1.03 | 1.04 | 1.02 | 1.02 | 1.05 | 1.05 |
| Rs | 11.98 | 1.00 | 0.79 | 0.72 | 0.68 | 0.73 | 0.70 | 0.84 | 0.81 | 0.89 | 0.89 | 0.74 | 0.73 |
| Rs3 | 15.38 | 1.00 | 0.72 | 0.60 | 0.55 | 0.60 | 0.56 | 0.76 | 0.73 | 0.84 | 0.84 | 0.64 | 0.60 |
| Rc | 4.88 | 1.00 | 0.74 | 0.33 | 0.28 | 0.43 | 0.32 | 0.79 | 0.60 | 0.84 | 0.84 | 0.37 | 0.35 |

*Fill factor < 40% was not given by H.A.L.M IV tester, so it was calculated by equation FF = $I_{mp} \times V_{mp}/I_{sc} \times V_{oc}$

TABLE 10

Compositions of Exemplary Pastes with Various Leaded Glass Frits

|  | Paste 1 | Paste 2 | Paste 3 | Paste 4 | Paste 5 |
|---|---|---|---|---|---|
| IRS Formulation | Reference 35C | 35D | 37G | 37H | 36i |
| Leaded Glass Frit 1 | 4.6  4.6 |  |  |  |  |
| Leaded Glass Frit 2 (PbO wt. % in glass = 70.85) |  | 4.7 |  |  |  |
| Leaded Glass Frit 3 (PbO wt. % in glass = 76.51) |  |  | 5 |  |  |
| Leaded Glass Frit 4 (PbO wt. % in glass = 70) |  |  |  | 4.5 |  |
| Leaded Glass Frit 5 PbO wt. % in glass = 66.94) |  |  |  |  | 3.1 |
| Eleme+ntal tellurium |    0.5 | 0.5 | 0.7 | 0.7 | 0.3 |
| PbO wt. % in IRS | 67.39%  60.78% | 64.04% | 67.11% | 60.58% | 61.03% |

TABLE 11

Electrical Performance Data of Exemplary Pastes as Compared to Reference Paste 1

|  | Paste 1 | 35C | 35D | 37G | 37H | 36i |
|---|---|---|---|---|---|---|
| Eff | 1.00 | 1.34 | 1.30 | 1.33 | 1.21 | 1.23 |
| FF | 1.00 | 1.36 | 1.32 | 1.37 | 1.25 | 1.25 |
| Rs | 1.00 | 0.42 | 0.53 | 0.22 | 0.68 | 0.65 |
| Rs3 | 1.00 | 0.20 | 0.27 | 0.18 | 0.44 | 0.43 |
| Rc | 1.00 | 0.11 | 0.20 | 0.10 | 0.50 | 0.81 |

These and other advantages of the invention will be apparent to those skilled in the art from the foregoing specification. Accordingly, it will be recognized by those skilled in the art that changes or modifications may be made to the above described embodiments without departing from the broad inventive concepts of the invention. Specific dimensions of any particular embodiment are described for illustration purposes only. It should therefore be understood that this invention is not limited to the particular embodiments described herein, but is intended to include all changes and modifications that are within the scope and spirit of the invention.

What is claimed:

1. An electroconductive paste composition for use in forming solar cell electrodes consisting essentially of:
    about 75-95 wt. % conductive metallic particles, based upon total solid content of the paste;
    an inorganic reaction system comprising a lead containing composition and elemental tellurium, wherein the lead containing composition is between 5-95 wt. % of the inorganic reaction system, and the elemental tellurium is between 5-95 wt. % of the inorganic reaction system; and
    an organic vehicle.

2. The electroconductive paste as in claim 1, wherein the conductive metallic particles are at least one of silver, gold, copper, and nickel.

3. The electroconductive paste as in claim 2, wherein the conductive metallic particles are silver.

4. The electroconductive paste as in claim 1, wherein the organic vehicle comprises a binder, a surfactant, an organic solvent, and a thixotropic agent.

5. The electroconductive paste as in claim 4, wherein the organic vehicle comprises a binder comprising at least one of ethylcellulose or phenolic resin, acrylic, polyvinyl butyral or polyester resin, polycarbonate, polyethylene or polyurethane resins, or rosin derivatives.

6. The electroconductive paste as in claim 4, wherein the organic vehicle comprises a surfactant comprising at least one of polyethyleneoxide, polyethyleneglycol, benzotriazole, poly(ethyleneglycol)acetic acid, lauric acid, oleic acid, capric acid, myristic acid, linolic acid, stearic acid, palmitic acid, stearate salts, palmitate salts, and mixtures thereof.

7. The electroconductive paste as in claim 4, where the organic vehicle comprises a solvent comprising at least one of carbitol, terpineol, hexyl carbitol, texanol, butyl carbitol, butyl carbitol acetate, or dimethyladipate or glycol ether.

8. The electroconductive paste as in claim 4, wherein the binder is about 1-10 wt. % of the organic vehicle.

9. The electroconductive paste as in claim 4, wherein the surfactant is about 1-10 wt. % of the organic vehicle.

10. The electroconductive paste as in claim 4, wherein the organic solvent is about 50-70% wt. % of the organic vehicle.

11. The electroconductive paste as in claim 4, wherein the thixotropic agent is about 0.1-5 wt. % of the organic vehicle.

12. A solar cell produced by applying an electroconductive paste to a silicon wafer and firing the silicon wafer according to an appropriate profile, the electroconductive paste comprising:
   metallic particles,
   an inorganic reaction system comprising a lead containing composition and elemental tellurium, wherein the lead containing composition is between 5-95 wt. % of the inorganic reaction system, and the elemental tellurium is between 5-95 wt. % of the inorganic reaction system, and
   an organic vehicle.

13. A solar cell module comprising electrically interconnected solar cells as in claim 12.

14. A method of producing a solar cell, comprising the steps of:
   providing a silicon wafer comprising an anti-reflective layer on a surface thereof;
   applying an electroconductive paste to the anti-reflective layer, the electroconductive paste comprising,
   metallic particles,
   an inorganic reaction system comprising a lead containing composition and elemental tellurium, wherein the lead containing composition is between 5-95 wt. % of the inorganic reaction system, and the elemental tellurium is between 5-95 wt. % of the inorganic reaction system, and
   an organic vehicle; and
   firing the silicon wafer according to an appropriate profile.

15. The electroconductive paste composition of claim 1, wherein the lead containing composition is between 40-90 wt. % of the inorganic reaction system, and the elemental tellurium is between 10-40 wt. % of the inorganic reaction system.

16. The electroconductive paste composition of claim 1, wherein the lead containing composition is a glass frit.

17. The electroconductive paste composition of claim 1, wherein the lead containing composition comprises lead oxide.

18. The electroconductive paste composition of claim 1, wherein the lead containing composition comprises between about 10-90 wt. %, preferably about 45-75 wt. %, lead oxide.

* * * * *